(12) United States Patent
Chakrabarti

(10) Patent No.: US 7,020,676 B2
(45) Date of Patent: Mar. 28, 2006

(54) NON-RECIPROCAL NETWORK ELEMENT THAT PRODUCES AN INPUT IMPEDANCE THAT IS A PRODUCT OF ITS LOAD IMPEDANCES

(75) Inventor: Satyabrata Chakrabarti, Aurora, IL (US)

(73) Assignee: Lucent Technologies Inc., Murray HIll, NJ (US)

( * ) Notice: Subject to any disclaimer, the term of this patent is extended or adjusted under 35 U.S.C. 154(b) by 698 days.

(21) Appl. No.: 10/260,873

(22) Filed: Sep. 27, 2002

(65) Prior Publication Data

US 2004/0064496 A1    Apr. 1, 2004

(51) Int. Cl.
*G06G 7/16* (2006.01)
(52) U.S. Cl. .................................................. 708/835
(58) Field of Classification Search ................. 708/835
See application file for complete search history.

(56) References Cited

U.S. PATENT DOCUMENTS 3,612,780 A * 10/1971 Beurrier et al. ............. 333/109
3,644,851 A *  2/1972 Daniels ....................... 333/215
5,903,198 A *  5/1999 Weiss ......................... 333/24.1

* cited by examiner

Primary Examiner—Tan V. Mai

(57) ABSTRACT

The Impedance Product Operator can be implemented in a number of embodiments to produce a new non-reciprocal (n+1)-port network element with the distinguishing property that if n 2-termial impedances, $Z_2, \ldots Z_{n+1}$ are connected at ports $2, \ldots, n+1$ of an Impedance Product Operator, the input impedance offered by this loaded multi-port at port 1 is $$Z_{(1)} = \prod_{k=2}^{n+1} Z_k.$$

As a single network element, the Impedance Product Operator offers a direct yet general mechanism for multiplication of 2-terminal impedance functions. This network element allows simpler and more direct synthesis of driving point impedance functions.

16 Claims, 12 Drawing Sheets

NON-RECIPROCAL NETWORK ELEMENT THAT PRODUCES AN INPUT IMPEDANCE THAT IS A PRODUCT OF ITS LOAD IMPEDANCES

CROSS-REFERENCE TO RELATED APPLICATIONS

This application is related to an application titled "Non-Reciprocal Network Element That Produces An Input Impedance That Is A Function Of The Multiplication-Division Of Its Load Impedances", filed on Sep. 27, 2002, Ser. No. 10/260,088.

FIELD OF THE INVENTION

This invention relates to multi-port network elements that have a determinable and controllable impedance at their input port, which input impedance is a product of the load impedances.

PROBLEM

It is a problem in the field of linear electrical networks to synthesize a network element which presents an impedance that represents the multiplication or division of two arbitrary real rational functions.

The synthesis of linear electrical networks in the frequency domain is a mature, well-understood discipline. Both passive and active elements are used to synthesize networks, with filters and various generalized immittance transformers being among the major applications of this technology. A modern analog circuit designer is almost always asked to synthesize circuits that admit implementation as an IC chip or part of a VLSI layout using only resistors, capacitors and transistors as the building blocks. Synthesis of arbitrary real rational functions of the complex frequency variable 's' in the form of $$\frac{N(s)}{D(s)}$$

as a driving-point impedance function, where N(s) and D(s) are both polynomials with rational coefficients, is one of the fundamental problems of network synthesis. A vast number of solution techniques exist, all requiring generally complex manipulation of rational functions. The toolkit of analog circuit designers includes well-known network elements such as current conveyors, gyrators, various negative immittance converters and inverters, different types of controlled sources, etc., all of which admit direct IC implementations. These elements, together with resistors and capacitors, constitute the foundation of analog circuit design. However, even with these capabilities, the synthesis of a network element which presents an impedance that represents the multiplication or division of two arbitrary real rational functions remains a difficult problem to solve.

SOLUTION

The above described problems are solved and a technical advance achieved by the present non-reciprocal network element that produces an input impedance that is a product of its load impedances, termed "Impedance Product Operator" herein. The Impedance Product Operator can be implemented in a number of embodiments to produce a new non-reciprocal (n+1)-port, $n \geq 3$, network element which has the distinguishing property that if n 2-terminal impedances, $Z_2, Z_3, \ldots Z_{n+1}$ are connected at ports $2, \ldots, n+1$ of an Impedance Product Operator, the input impedance offered by this loaded multi-port at port 1 is $$Z_{(1)} = \prod_{k=2}^{n+1} Z_k.$$

As a single network element, the Impedance Product Operator offers a direct yet general mechanism for multiplication of 2-terminal impedance functions. This network element allows simpler and more direct synthesis of driving point impedance functions.

The implementations disclosed herein address a non-reciprocal 3-port network element called a Positive Impedance Product Operator which has the distinguishing property that if two 2-terminal impedances, $Z_2$ and $Z_3$ are connected at ports 2 and 3 of a Positive Impedance Product Operator, the input impedance offered by this loaded 3-port at port 1 is $Z_1 = Z_2 Z_3$. A Negative Impedance Product Operator version of the Positive Impedance Product Operator is also disclosed. A more general multi-port Impedance Product Operator is disclosed for both positive and negative impedance applications for use where more than two terminal impedances are required to implement the desired input impedance function.

DETAILED DESCRIPTION OF THE DRAWINGS

The present non-reciprocal network element produces an input impedance that is a product of its load impedances, termed "Impedance Product Operator" herein. The Impedance Product Operator can be implemented in a number of embodiments to produce a new non-reciprocal (n+1)-port, $n \geq 3$, network element which has the distinguishing property that if n 2-termial impedances, $Z_2, Z_3, \ldots, Z_{n+1}$ are connected at ports $2, \ldots, n+1$ of an Impedance Product Operator, the input impedance offered by this loaded multi-port at port 1 is $$Z_{(1)} = \prod_{k=2}^{n+1} Z_k.$$

As a single network element, the Impedance Product Operator offers a direct yet general mechanism for multiplication of 2-terminal impedance functions. This network element allows simpler and more direct synthesis of driving point impedance functions.

The implementations disclosed herein address a non-reciprocal 3-port network element called a Positive Impedance Product Operator which has the distinguishing property that if two 2-terminal impedances, $Z_2$ and $Z_3$ are connected at ports 2 and 3 of a Positive Impedance Product Operator, the input impedance offered by this loaded 3-port at port 1 is $Z_1 = Z_2 Z_3$. A Negative Impedance Product Operator version of the Positive Impedance Product Operator is also disclosed. A more general multi-port Impedance Product Operator is disclosed for both positive and negative impedance applications for use where more than two 2-terminal impedances are required to implement the desired input impedance function.

Positive Impedance Product Operator

Figure 1:
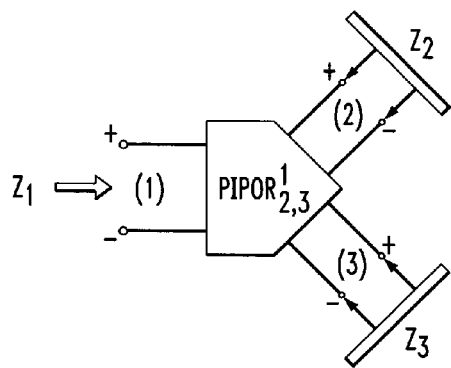
FIG. 1 illustrates in block diagram form a representation of a Positive Impedance Product Operator network element.

The Positive Impedance Product Operator, as shown in FIG. 1, is a non-reciprocal 3-port network element which has a distinguishing property that if two 2-terminal impedance functions $Z_2(s)$ and $Z_3(s)$ are connected at ports 2 and 3 of a Positive Impedance Product Operator, the input impedance offered by this loaded 3-port at port 1 is $Z_{(1)}(s) = Z_2(s)Z_3(s)$. The availability of such a network element obviously adds significant flexibility in solving the general synthesis problems for immittance functions.

The following hybrid matrix conveniently expresses the relationship among the voltage- and current-variables at the ports of a Positive Impedance Product Operator:

$$\begin{bmatrix} I_1 \\ V_2 \\ V_3 \end{bmatrix} \begin{bmatrix} 0 & 0 & -1 \\ 1 & 0 & 0 \\ 0 & -1 & 0 \end{bmatrix} \begin{bmatrix} V_1 \\ I_2 \\ I_3 \end{bmatrix} \quad (1)$$

where $V_j$ and $I_j$ denote the voltage- and current-variables at the jth port, j=1, 2, 3, respectively.

Figure 2:
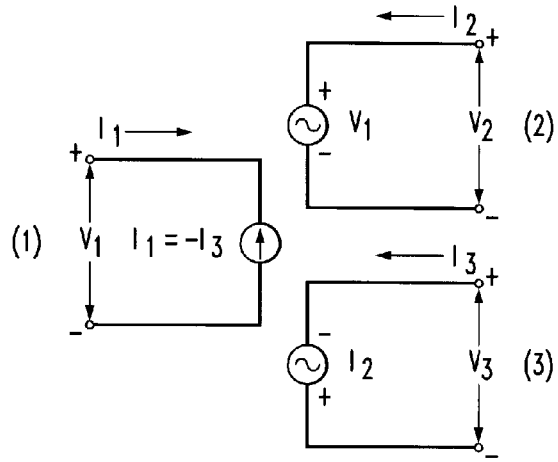
FIG. 2 illustrates a controlled source representation of the Positive Impedance Product Operator network element of FIG. 1.

The hybrid matrix of Equation (1) immediately yields the controlled source representation of FIG. 2. Referring back to FIG. 1, assume that the two 2-terminal impedances, $Z_2$ and $Z_3$, are connected as loads at ports 2 and 3 of the circuit of FIG. 2, respectively. Since all port currents are shown to be flowing inside:

$$I_1 = -I_3 = -\frac{V_3}{Z_3} = +\frac{I_2}{Z_3} = \frac{V_2}{Z_2} \times \frac{1}{Z_3} = \frac{V_2}{Z_2 Z_3} = \frac{V_1}{Z_2 Z_3}.$$

Hence, the input impedance seen at port 1, $Z_{(1)}$, is given by:

$$Z_{(1)} = \frac{V_1}{I_1} = Z_2 Z_3. \quad (2)$$

The configuration of FIG. 2 is therefore the controlled-source equivalent representation of a Positive Impedance Product Operator. A Positive Impedance Product Operator is realizable using only suitable controlled sources.

Figure 3:
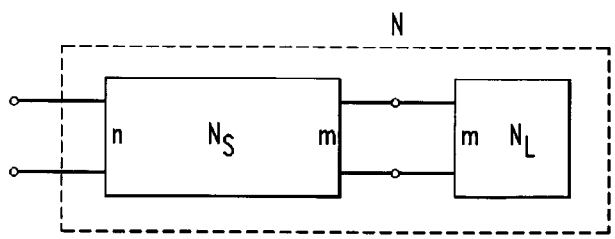
FIG. 3 illustrates the interconnection of an (n+m)-port network element with an n-port network element.

FIG. 3 illustrates the interconnection of an (n+m)-port network element $N_S$, loaded by an m-port network element $N_L$. Let $Z_S$, $Z_L$, and Z denote the multi-port impedance matrices of $N_S$, $N_L$, and the resultant n-port network element N shown in FIG. 3. Consider the partitioned representation of $Z_S$ shown in Equation (3):

$$Z_S = \begin{bmatrix} Z_{11} & Z_{12} \\ \hline Z_{21} & Z_{22} \end{bmatrix}_m^n ; \quad (3)$$
$$\quad n \quad m$$

The number of rows and columns for the partitioned submatrices are shown on the right and the bottom, respectively. The multi-port impedance matrix of network element N is then given by:

$$Z = Z_{11} - Z_{12}(Z_{22}+Z_L)^{-1}Z_{21}. \quad (4)$$

Let $I_m$ denote the m×m identity matrix. For $Z_{11}=Z_{22}=0$ and for $Z_L=I_m$, Equation (4) reduces to:

$$Z = -Z_{12}Z_{21}. \quad (5)$$

A multi-port described by a Z-matrix with $Z_{11}=Z_{22}=0$ corresponds to an impedance inverter type configuration. The positive impedance inverters are more commonly known as gyrators, and for such multi-ports, $Z_{12}$ and $Z_{21}$ are of opposite signs. If $N_S$ is a gyrator-type multi-port, and $Z_L=I_m$, Equation (5) guarantees that $Z=Z_{12}Z_{21}$.

Figure 4:
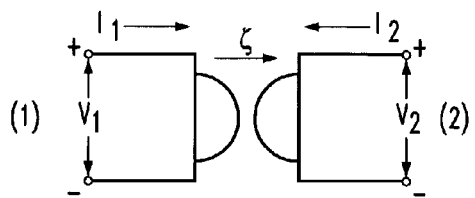
FIGS. 4 and 5 illustrate the symbol for a gyrator and a gyrator terminated with a unit resistor, respectively.
Figure 5:
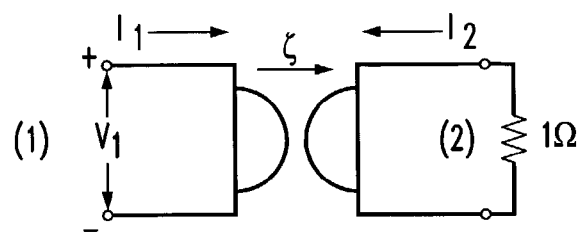

FIGS. 4 and 5, respectively, show a conventional gyrator and a gyrator loaded with a unit resistor at port 2. The impedance matrix of a gyrator-type 2-port is of the one of the following two forms:

$$\begin{bmatrix} 0 & -Z_2 \\ Z_3 & 0 \end{bmatrix}, \text{ or } \begin{bmatrix} 0 & Z_2 \\ -Z_3 & 0 \end{bmatrix}, \zeta = \sqrt{Z_2 Z_3}$$

Then, from Equation (5) the driving point impedance at port 1 of FIG. 4 is:

$$Z_{(1)} = Z_2 Z_3 \quad (6)$$

which is identical to Equation (2).

Figure 6:
FIGS. 6 and 7 illustrate the conventional circuit symbols that are used to represent a nullator and a norator, respectively.
Figure 7:

This is not a solution to the stated problem, since there is not a 3-port network element in FIG. 4. Conventional circuit theory does not reach inside a gyrator which requires the use of so-called pathological circuit elements. There are two pathological elements that are used for this purpose: one is called a norator, the other a nullator. A nullator, conventionally represented as in FIG. 6, is a 2-terminal element with the voltage-current relationship described by v=i=0. This 1-port network element is called pathological for it is clear from the definition that the nullator is simultaneously an open circuit and a short circuit. The second pathological one-port, the norator, is characterized by the fact that its terminal variables v and i are completely arbitrary. The conventional symbol of a norator is shown in FIG. 7.

Any linear time-invariant lumped n-port could be realized by means of the common passive network elements, together with the negative resistor, the norator, and the nullator. The number of norators and nullators present in a network must be equal in order to avoid inconsistencies in the network equilibrium equations. Since one of the conditions necessary for "physical realizability" is that the equilibrium equations corresponding to a network are consistent, the networks containing equal number of norators and nullators may be physically realizable, but those with unequal number of these pathological network elements will never be so.

Figure 8:
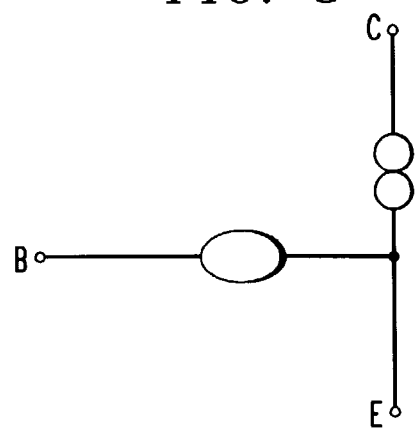
FIG. 8 illustrates the interconnection of a nullator-norator pair to implement an ideal transistor.

FIG. 8 shows the equivalence between such a norator-nullator pair and an ideal bipolar junction transistor, where the emitter E, base B, and collector C terminals of the equivalent ideal transistor are identified in the 3-terminal norator-nullator model. An ideal transistor is a three-terminal device for which the input base current is zero, the base-emitter voltage drop is zero, the emitter-to-collector current ratio is unity, and an arbitrary voltage can exist across the collector and the emitter terminals while an arbitrary emitter current flows.

An ideal transistor is equally unrealizable in practice as a norator or a nullator. However, every algebraic characteristic (i.e., the form of its system functions including the sign of the coefficients, form of the system matrices, etc.) derived from a network containing norators and nullators corresponding to an equivalent transistorized network, is completely and consistently preserved even if the ideal transistors are replaced by physically realizable non-ideal transistors operating in the linear regime. These are the most common assumption for transistors in IC designs, regardless of the frequency range. Researchers have realized from the beginning that the passage from the norator-nullator representations to the equivalent transistor-resistor realizations is seldom straightforward in practice because of the difficulties in ensuring suitable DC biasing. The biasing issues are even more daunting for complex multi-port realizations with multiple transistors, which frequently require the use of floating power supplies and various voltage and current isolation mechanisms.

The equivalence between an idealized transistor and a norator-nullator pair came via the notion of yet another idealized pathological network element called nullor, where the norator-nullator pair really represents the nullor. A nullor is a universal active element in the sense that any active element can be represented using only nullors and passive components. The "universality" of nullors, and consequently its equivalent norator-nullator representation led to the recognition of another universal active element called a second generation current conveyor (CCII) from its equivalence with the nullor.

Figure 9:
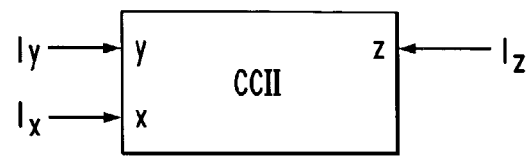
FIGS. 9 and 10 illustrate the representation of an ideal current conveyor and its nullator-norator equivalent, respectively.
Figure 10:
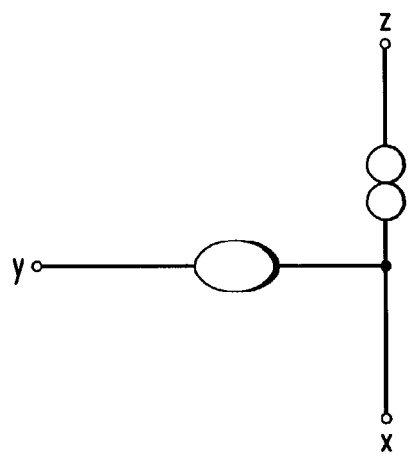
Figure 11:
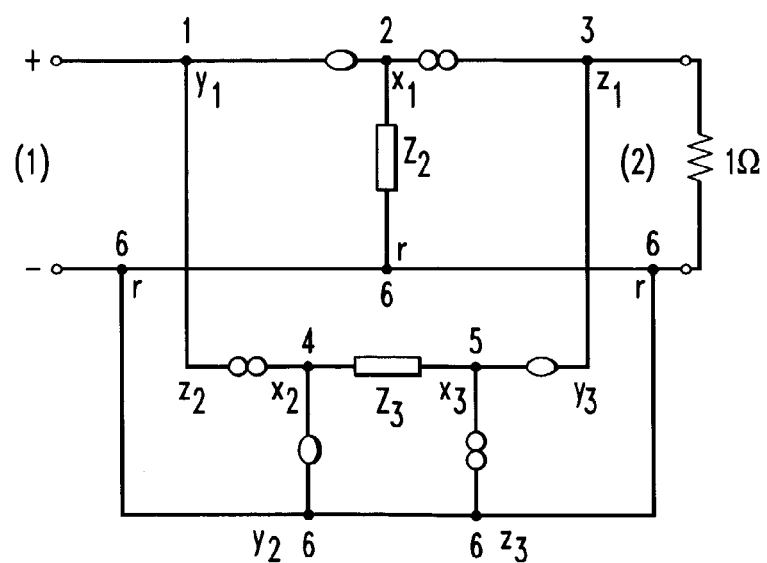
FIG. 11 illustrates a nullator-norator equivalent model of a gyrator loaded with a unit resistor.

The ideal CCII, shown in FIG. 9, is a three-port device with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix}; \quad (7)$$

where the ± sign in Equation (7) is used to denote whether the current conveyor is designed to operate with a positive or negative unity gain, respectively designated as CCII+ and CCII−. Following the usual custom, a current conveyor is a 3-terminal device, similar to that for transistors, where the terminal voltages and currents are with respect to a specific reference terminal (usually the ground) external to the circuit element. FIG. 10 corresponds more to a 3-terminal representation than a 3-port representation. The corresponding norator-nullator equivalent model for a CCII is shown in FIG. 11. Observe that the same norator-nullator equivalent model is used to represent both a CCII+ and a CCII−, just as in the case of the norator-nullator equivalent model for a bipolar transistor, p-n-p or n-p-n, which is a consequence of the defining properties of these pathological network elements. Represented topologically, the equivalence between a norator-nullator pair on one hand and the transistors and CCII's on the other is identical. Extensive literature exists on the standardized IC implementations of both types of CCII's that can directly replace their idealized representations over a wide variety of voltage-current-frequency regimes, including high microwave regions.

Figure 12:
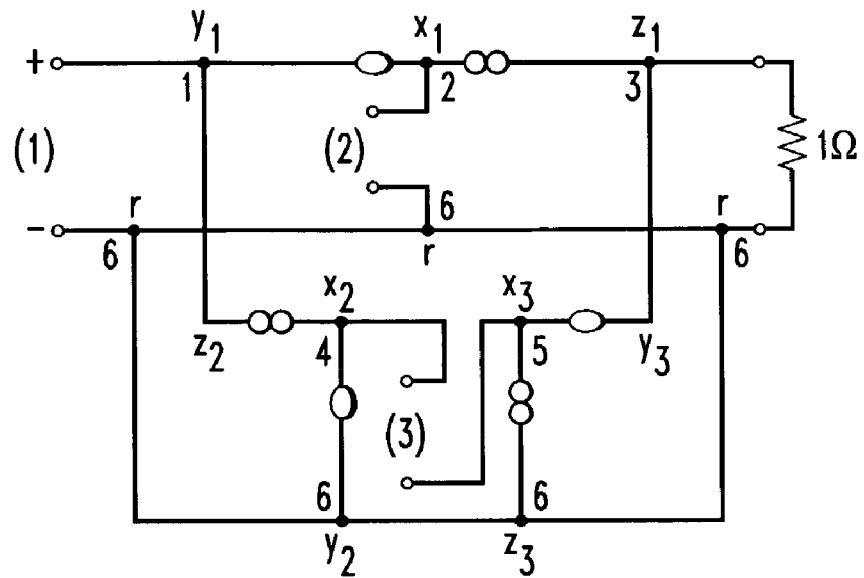
FIG. 12 illustrates a nullator-norator equivalent model of a Positive Impedance Product Operator network element that is derived from the nullator-norator equivalent model of a gyrator loaded with a unit resistor of FIG. 11.

The transistor-resistor realizations of Positive Impedance Product Operator are used to establish the basic principle of norator-nullator synthesis, although the intrinsic inconvenience of such realizations to ensure dc biasing becomes evident at a glance. A typical model corresponding to a 3-transistor implementation is chosen for its elegant T-π configuration, which is one of the most basic for analog circuit design. FIG. 12 shows the implementation of FIG. 4 using this equivalent norator-nullator model, where we are now able to reach inside. The rest of the synthesis for Positive Impedance Product Operator is straightforward. As soon as the branches marked $Z_2$ and $Z_3$ in FIG. 11 are replaced with open circuits, the 3-port configuration of FIG. 12 is obtained (observe the various node labeling carefully). The polarity of the terminals at ports 2 and 3 are determined by the eventual transistor assignments (see below). Conversely, it follows trivially that if the 2-port impedances $Z_2$ and $Z_3$ are reconnected at ports 2 and 3 respectively, and the network of FIG. 12 reverts back to the loaded gyrator configuration of FIG. 11 with the impedance seen at port 1 as $Z_{(1)}=Z_2 Z_3$. FIG. 12 is the desired norator-nullator equivalent model of a Positive Impedance Product Operator.

Figure 13:
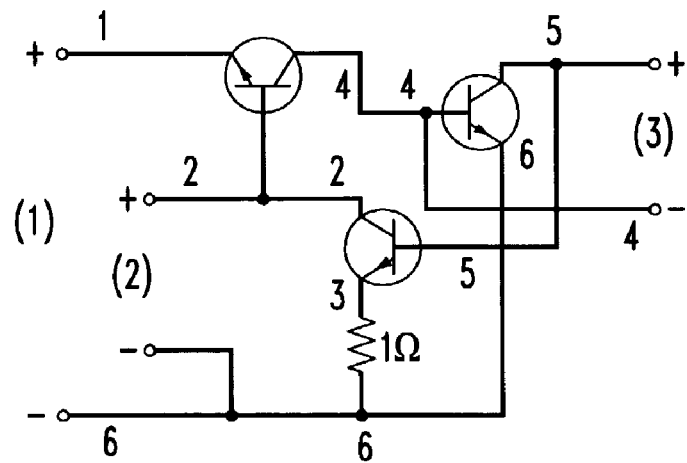
FIGS. 13 and 14 illustrate two unbiased transistor-resistor realizations of a Positive Impedance Product Operator network element.
Figure 14:
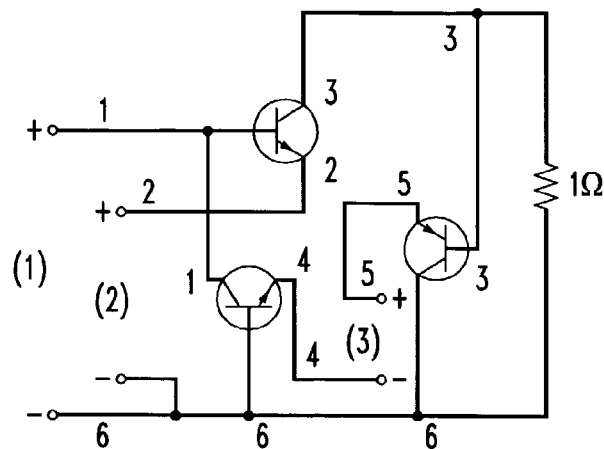

The transistorized realization of the Positive Impedance Product Operator is obtained by using the equivalence of FIG. 8 in FIG. 12. Two realizations of FIG. 12 using bipolar transistors are illustrated in FIGS. 13 and 14. Observe that the transistorized realizations of FIGS. 13 and 14 do not show biasing considerations; inspection reveals the biasing to be a difficult task.

A gyrator has many possible practical norator-nullator equivalent models. Consideration of symmetry groups, first associated with the admittance matrix, and at a secondary level associated with FIG. 12 as a basic combinatorial object, yields non-trivial alternatives. Consequently, so does a Positive Impedance Product Operator.

A more effective transistor-resistor realization of a Positive Impedance Product Operator is attained by using CCII that can be directly converted to straightforward IC designs using already published techniques and implementations. The CCII realization of the Positive Impedance Product Operator is obtained by using the equivalence of FIG. 10 in FIG. 12 which admits two distinct choices for assigning the norator-nullator pairs to CCIIs, which can be represented by their respective labeling schemes. Only one of the two possible realizations of FIG. 12 using ideal CCIIs is shown in FIG. 15.

Figure 15:
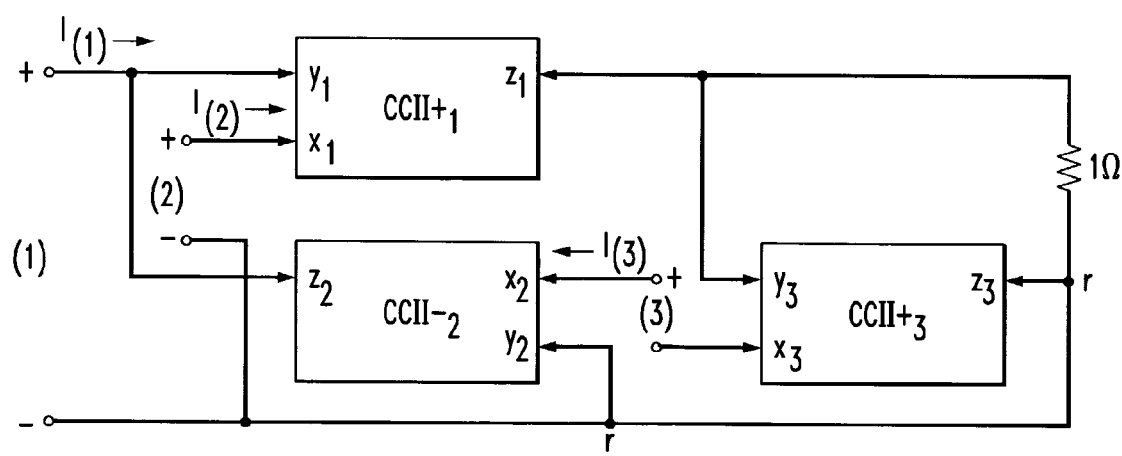
FIG. 15 illustrates in block diagram form the realization of a Positive Impedance Product Operator network element using ideal current conveyors.

To establish that the realization of FIG. 15 indeed implements the voltage-current relationships for a Positive Impedance Product Operator, let $V_{(k)}$ and $I_{(k)}$ denote the port voltages and currents with k=1, 2, 3, respectively. Likewise, let $V_{x_j}$ and $I_{x_j}$ respectively denote the voltage and current at terminal $x_j$ for $CCII_j$, j=1, 2, 3, as shown in FIG. 15. The terminal voltages are all measured with respect to a single uniquely specified reference terminal (which may be taken as the ground terminal if so desired), not shown in the diagram. In other words, in the general case, all the ports are floating and $I_{(1)}=-I_{(3)}$, $V_{(2)}=V_{(1)}$, and $V_{(3)}=-I_{(2)}$.

To demonstrate that $I_{(1)}=-I_{(3)}$:

In FIG. 15 $I_{(1)}=I_{y_1}+I_{z_2}=I_{z_2}$, for $I_{y_1}=0$ from the properties of CCII. By choosing a CCII− for $CCII_2$, as shown in FIG. 15, $I_{z_2}=-I_{x_2}=-I_3$, where the last equality is from the configuration of port 3.

To demonstrate that $V_{(2)}=V_{(1)}$:

In FIG. 15, $v_{(2)}=V_{x_1}$, where the port voltage $V_{(2)}$ is measured with respect to the same external reference terminal as for $V_{x_1}$. Then from the properties of CCII+, $V_{(2)}=V_{x_1}=V_{y_1}=V_{(1)}$, where the last equality is from the definition of the port voltage.

To demonstrate that $V_{(3)}=-I_{(2)}$:

In FIG. 15, $V_{(3)}=V_{x_2}-V_{x_3}$ by our reference convention. $CCII_3$ is a CCII+. Consequently, from the properties of CCII+: $V_{(3)}=V_{x_2}-V_{x_3}=V_{y_2}-V_{y_3}$. Observe that $I_{(2)}=I_{x_1}=I_{z_1}$ and $I_{y_3}=0$ where the last two equalities follow from the properties of CCII, and the assumption that $CCII_1$ is a CCII+. Thus, there is a voltage drop of $-I_2 \times 1$ Ω across the unit resistor which corresponds to $V_{z_1}-V_{z_3}$, with $V_r=V_{y_2}$ from the diagram. Hence, $V_{(3)}=V_{y_2}-V_{y_3}=V_r-V_{y_3}=V_r-V_{z_1}=V_r-I_2-V_r=-I_2$, as described.

This completes the proof that the circuit of FIG. 15 is a realization for a Positive Impedance Product Operator. Other alternative realizations can be derived in a similar manner.

Negative Impedance Product Operator

The Negative Impedance Product Operator is a non-reciprocal active 3-port network element that has a distinguishing property that if two 2-terminal impedance functions $Z_2(s)$ and $Z_3(s)$ are connected at ports 2 and 3 of a Negative Impedance Product Operator, the input impedance offered by this loaded 3-port at port 1 is $Z_{(1)}(s)=-Z_2(s)Z_3(s)$. This Negative Impedance Product Operator is analogous to the Positive Impedance Product Operator described above and the following description characterizes the differences between these two network elements.

The following hybrid matrix conveniently expresses the relationship among the voltage- and current-variables at the ports of a Negative Impedance Product Operator in a manner that is analogous to Equation 1:

$$\begin{bmatrix} I_1 \\ V_2 \\ V_3 \end{bmatrix} \begin{bmatrix} 0 & 0 & -1 \\ -1 & 0 & 0 \\ 0 & -1 & 0 \end{bmatrix} \begin{bmatrix} V_1 \\ I_2 \\ I_3 \end{bmatrix}, \quad (8)$$

where $V_j$ and $I_j$ denote the voltage- and current-variables at the jth port, j=1, 2, 3, respectively.

Figure 16:
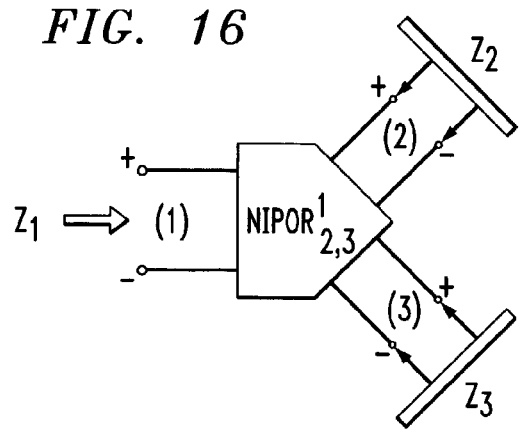
FIG. 16 illustrates in block diagram form a representation of a Negative Impedance Product Operator network element.
Figure 17:
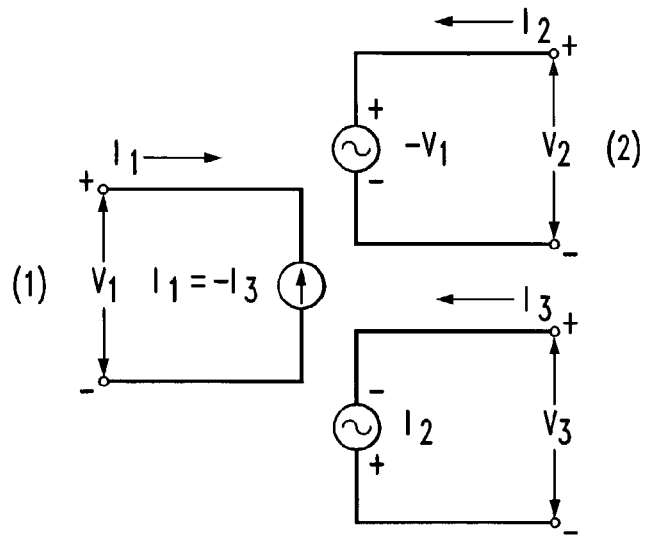
FIG. 17 illustrates a controlled source representation of the Negative Impedance Product Operator network element of FIG. 16.

The hybrid matrix of Equation (8) immediately yields the controlled source representation of FIG. 17. Referring back to FIG. 16, assume that the two 2-terminal impedances, $Z_2$ and $Z_3$, are connected as loads at ports 2 and 3 of the circuit of FIG. 17, respectively. Since all port currents are shown to be flowing inside:

$$I_1 = -I_3 = -\frac{V_3}{Z_3} = +\frac{I_2}{Z_3} = -\frac{V_2}{Z_2} \times \frac{1}{Z_3} = \frac{V_2}{Z_2 Z_3} = -\frac{V_1}{Z_2 Z_3}.$$

Hence, the input impedance seen at port 1, $Z_{(1)}$, is given by:

$$Z_{(1)} = \frac{V_1}{I_1} = -Z_2 Z_3. \quad (9)$$

The configuration of FIG. 17 is therefore the controlled-source equivalent representation of a Negative Impedance Product Operator. A Negative Impedance Product Operator is realizable using only suitable controlled sources. For the negative impedance inverter (NIV) type multi-ports, $Z_{12}$ and $Z_{21}$ are of the same negative sign. If $N_S$ is a NIV-type multi-port, and $Z_L=I_m$, Equation (9) guarantees that:

$$Z=-Z_{12}Z_{21}. \quad (10)$$

Figure 18:
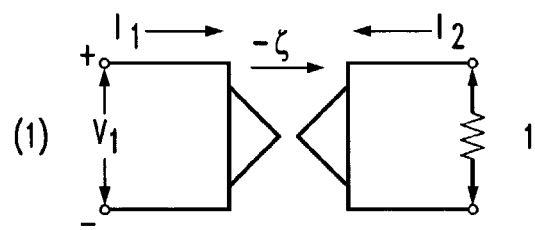
FIG. 18 illustrates the symbol for a negative impedance inverter terminated with a unit resistor.

FIG. 18 shows a negative impedance inverter loaded with a unit resistor at port 2. Recalling that the impedance matrix of a NIV-type 2-port is of the following form:

$$\begin{bmatrix} 0 & -Z_2 \\ -Z_3 & 0 \end{bmatrix}, \zeta = \sqrt{Z_2 Z_3},$$

from Equation (10) the driving point impedance at port 1 of FIG. 18 is:

$$Z_{(1)} = -Z_2 Z_3. \qquad (11)$$

Figure 19:
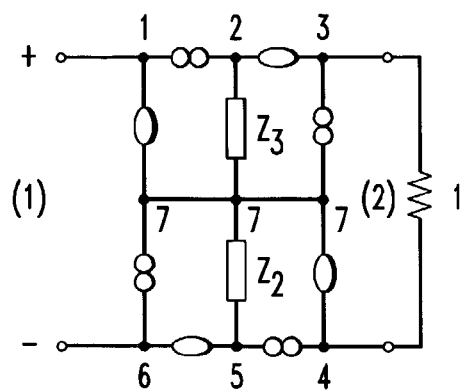
FIG. 19 illustrates a nullator-norator equivalent model of a negative impedance inverter loaded with a unit resistor.
Figure 20:
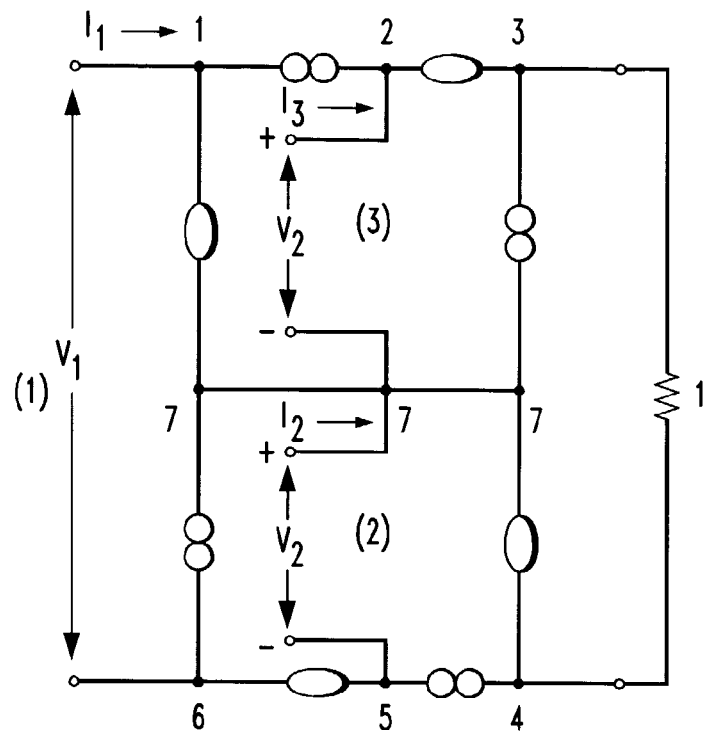
FIG. 20 illustrates a nullator-norator equivalent model of a Negative Impedance Product Operator network element that is derived from the nullator-norator equivalent model of a negative impedance inverter loaded with a unit resistor of FIG. 19.

As done above with respect to the Positive Impedance Product Operator, FIG. 19 shows the implementation of FIG. 16 using an equivalent norator-nullator model. The branches marked $Z_2$ and $Z_3$ in FIG. 19, are replaced with open circuits, to obtain the 3-port configuration of FIG. 20. Conversely, if the 2-port impedances $Z_2$ and $Z_3$ are reconnected at ports 2 and 3, respectively, the network of FIG. 20 reverts back to the loaded negative impedance inverter configuration of FIG. 19 with the impedance seen at port 1 as $Z_{(1)} = Z_2 Z_3$. FIG. 20 is the desired norator-nullator equivalent model of a Negative Impedance Product Operator.

Figure 21:
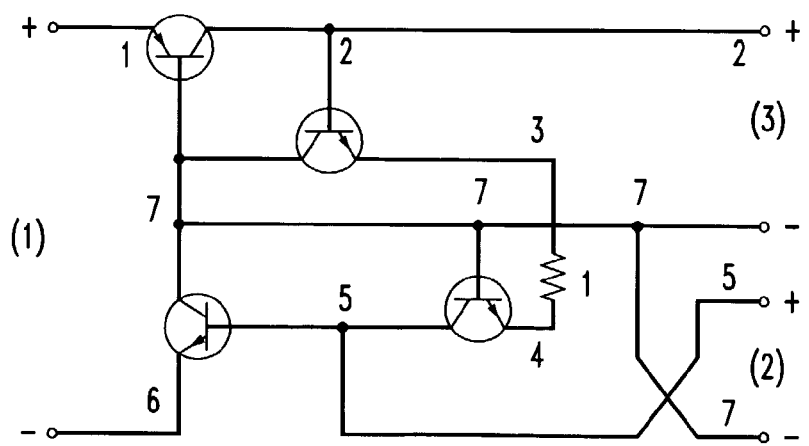
FIGS. 21 and 22 illustrate two unbiased transistor-resistor realizations of a Negative Impedance Product Operator network element.
Figure 22:
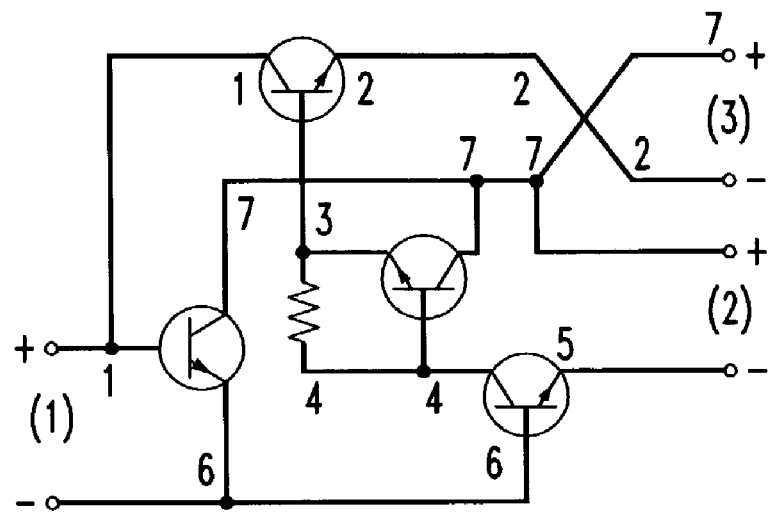

The transistorized realization of the Negative Impedance Product Operator is obtained by using the equivalence of FIG. 8 in FIG. 20. Two realizations of FIG. 20 using bipolar transistors are shown in FIGS. 21 and 22, which are convenient for IC fabrication of a Negative Impedance Product Operator.

General Positive Impedance Product Operator

Figure 23:
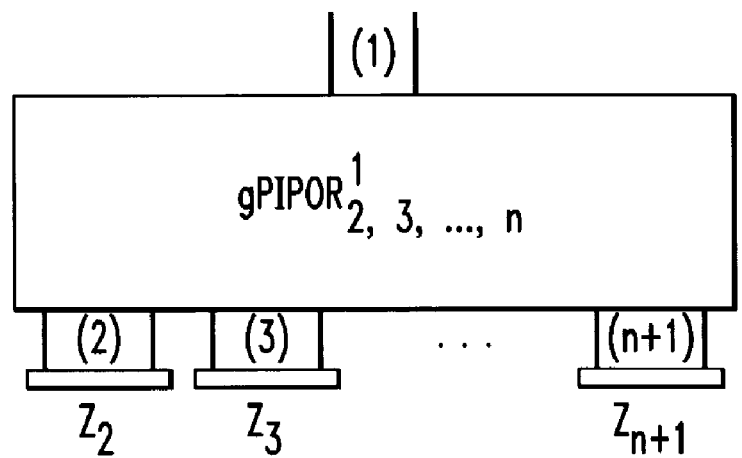
FIG. 23 illustrates in block diagram form a representation of a Generalized Positive Impedance Product Operator network element.

The General Positive Impedance Product Operator, as shown in FIG. 23, is a non-reciprocal (n+1)-port, n≧3, network element with the distinguishing property that if n 2-terminal impedance functions $Z_2(s), Z_3(s), \ldots, Z_{n+1}(s)$ are connected at ports 2, . . . , n+1 of a General Positive Impedance Product Operator, the input impedance offered by this loaded multi-port at port 1 is:

$$Z_{(1)}(s) = \prod_{k=2}^{n+1} Z_k(s). \qquad (12)$$

As a single network element, General Positive Impedance Product Operator thus offers a direct yet general mechanism for multiplication of 2-terminal impedance functions.

Figure 24:
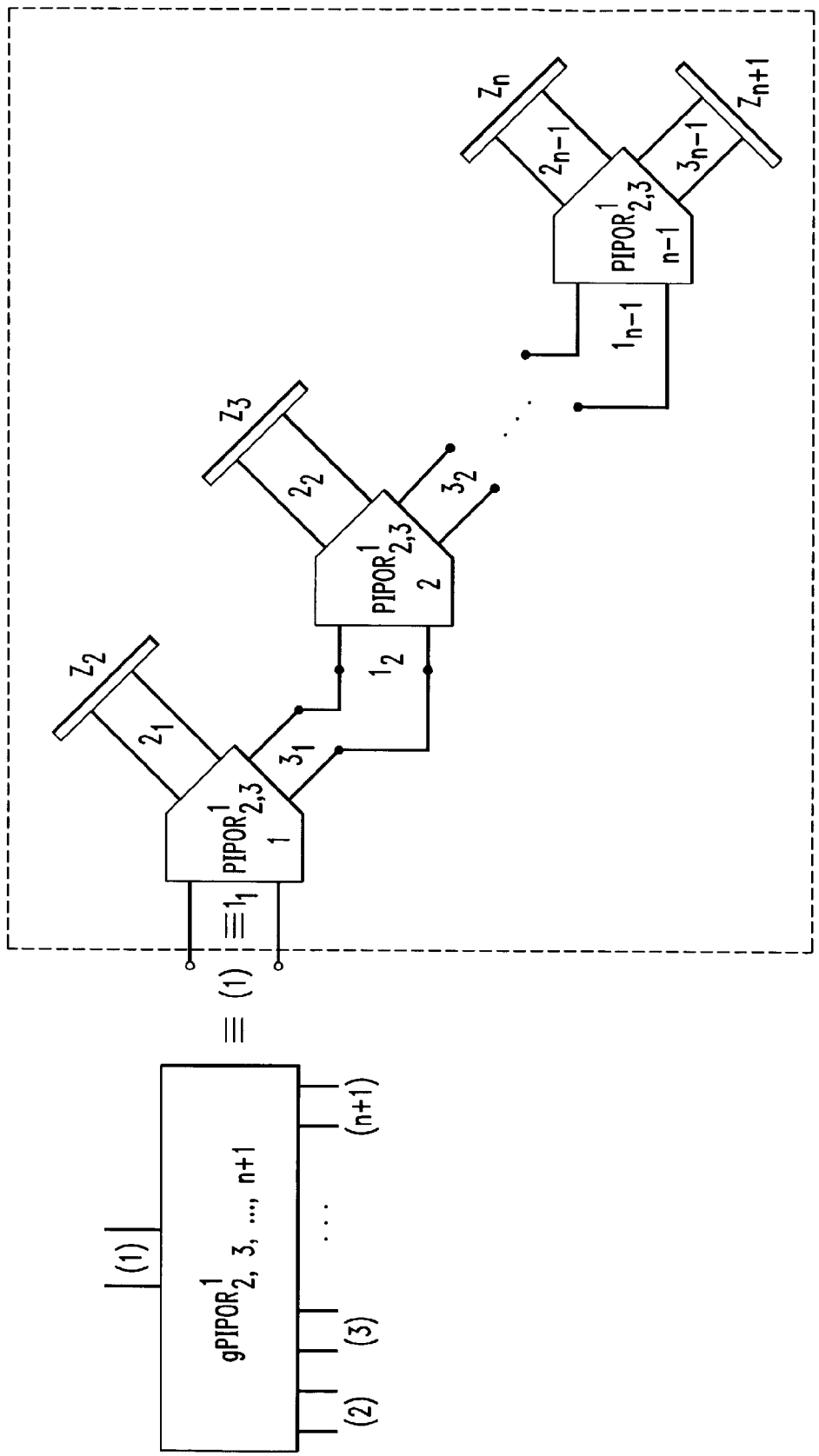
FIG. 24 illustrates in block diagram form a representation of a Generalized Positive Impedance Product Operator network element implemented as a cascade of (n−1) Positive Impedance Product Operator network elements.

Physical realizations of General Positive Impedance Product Operators are done most naturally by using the above-described non-reciprocal active 3-port Positive Impedance Product Operator. A Positive Impedance Product Operator is a special case of a (n+1)-port General Positive Impedance Product Operator with n=2. A (n+1)-port General Positive Impedance Product Operator, n>3, is created by cascading (n-1) Positive Impedance Product Operators and appropriately terminating them with 2-terminal impedances, as shown in FIG. 24. Consider the k-th Positive Impedance Product Operator, with k ranging over 1, 2, . . . , n-1. Using the convention of FIG. 1, let $1_k$, $2_k$ and $3_k$ respectively denote the input and the two loading ports of the k-th Positive Impedance Product Operator. As shown in FIG. 24, port $2_k$ is terminated with the 2-terminal impedance $Z_{k+1}$, while port $3_k$ is terminated with the (k+1)-th Positive Impedance Product Operator for k=1, 2, . . . , (n-2); port $3_k$ is terminated with the load $Z_{n+1}$ for k=n-1.

It is easy to see by induction that the configuration of FIG. 24 indeed is a General Positive Impedance Product Operator. First consider the case of the (n-1)th Positive Impedance Product Operator terminated with loads $Z_n$ and $Z_{n+1}$ at ports $2_{n-1}$ and $3_{n-1}$, respectively. By definition, the (n-2)th Positive Impedance Product Operator, terminated with the load $Z_{n-1}$ at port $2_{n-2}$, is also effectively terminated with the load $Z_n Z_{n+1}$ at port $3_{n-2}$. Hence, the impedance seen at port $1_{n-2}$ is $Z_{n-1} Z_n Z_{n+1}$. Continuing in this manner, it is evident that the impedance offered by the loaded k-th Positive Impedance Product Operator at port $1_k$ in FIG. 3 is $$Z_{k+1} \times (\text{impedance seen at port } 1_{k+1} \text{ of the loaded}(k+1)\text{th Positive Impedance Product Operator}) = Z_{k+1} \times \prod_{i=k+2}^{n+1} Z_i = \prod_{i=k+1}^{n+1} Z_i.$$

Specifically, for k=1, the impedance seen at the input or port (1) of the General Positive Impedance Product Operator is $$\prod_{i=2}^{n+1} Z_i,$$

as asserted.

Figure 25:
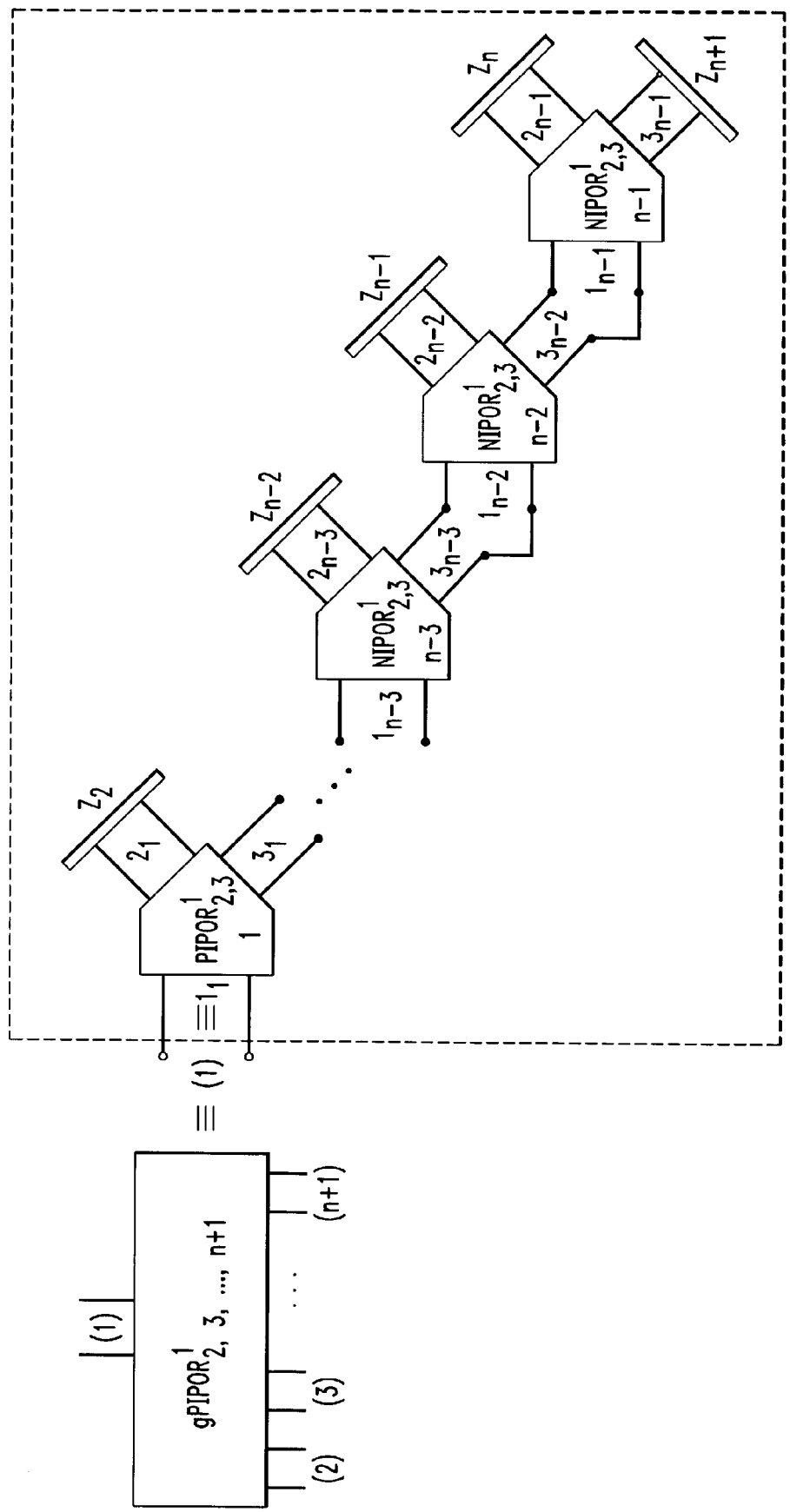
FIG. 25 illustrates in block diagram form a representation of a Generalized Positive Impedance Product Operator network element implemented as a cascade of 2 Negative Impedance Product Operator network elements preceded by (n−3) Positive Impedance Product Operator network elements.

Alternative Realizations Using Positive Impedance Product Operators and Negative Impedance Product Operators Cascaded Positive Impedance Product Operators have been shown to realize a General Positive Impedance Product Operator in the previous section. Negative Impedance Product Operators, together with the Positive Impedance Product Operators, can also be used for such realizations. Observe that the General Positive Impedance Product Operator cascade of FIG. 24 could have been constructed with an even number of Negative Impedance Product Operators and the rest as Positive Impedance Product Operators. As long as there are an even number of Negative Impedance Product Operators in cascade, the sign of the overall product seen at the input of the General Positive Impedance Product Operator is always positive. Indeed, the even number of Negative Impedance Product Operators may be interspersed with Positive Impedance Product Operators anywhere in the cascade preserving the desired impedance multiplication property of the General Positive Impedance Product Operator—the effect is permutation invariant with respect to the placement of the elements themselves. A specific implementation of a General Positive Impedance Product Operator using two Negative Impedance Product Operators at the end of a cascade of Positive Impedance Product Operators is shown in FIG. 25.

General Negative Impedance Product Operator

Figure 26:
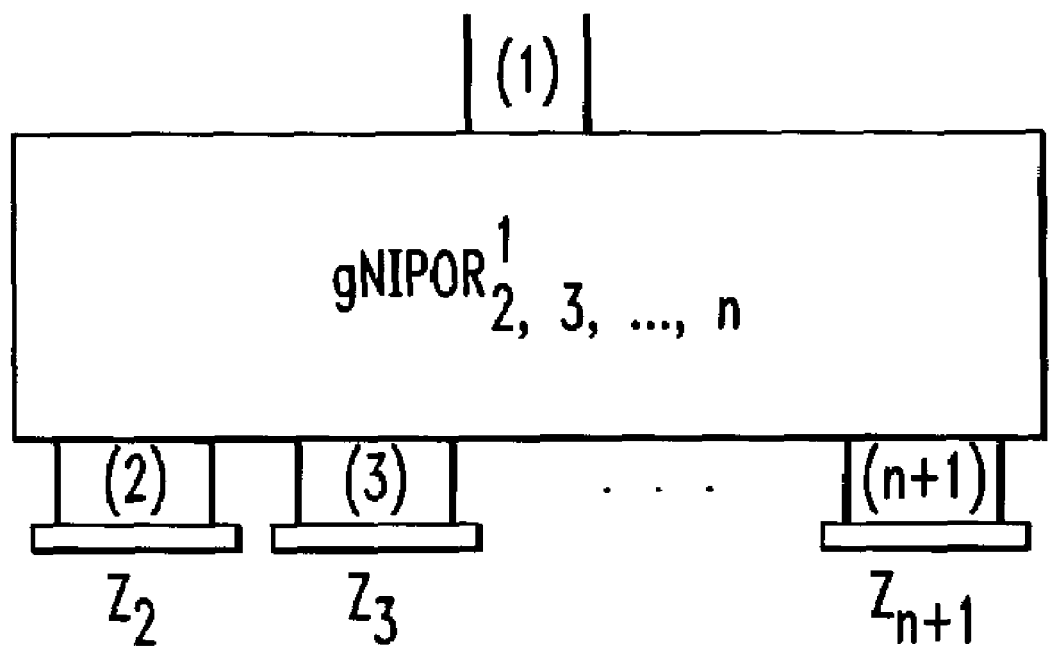
FIG. 26 illustrates in block diagram form a representation of a Generalized Negative Impedance Product Operator network element.

The General Negative Impedance Product Operator, as shown in FIG. 26, is a non-reciprocal (n+1)-port, n≧3, network element with the distinguishing property that if n 2-terminal impedance functions $Z_2(s), Z_3(s), \ldots, Z_{n+1}(s)$ are connected at ports 2, 3, . . . , (n+1) of a General Positive Impedance Product Operator, the input impedance offered by this loaded multi-port at port 1 is:

$$Z_{(1)}(s) = -\prod_{k=2}^{n+1} Z_k(s). \quad (13)$$

Physical realizations of General Negative Impedance Product Operators are done most naturally by using two types of non-reciprocal active 3-ports, called Negative Impedance Product Operator and Positive Impedance Product Operator. A Negative Impedance Product Operator is a special case of a (n+1)-port General Negative Impedance Product Operator with n=2. A Positive Impedance Product Operator is the positive counterpart of a Negative Impedance Product Operator in that if two 2-terminal impedances $Z_2$ and $Z_3$ are connected at ports 2 and 3 of a Positive Impedance Product Operator, the input impedance offered by this loaded multi-port at port 1 is $Z_{(1)}=Z_2 Z_3$, as shown in FIG. 26.

Figure 27:
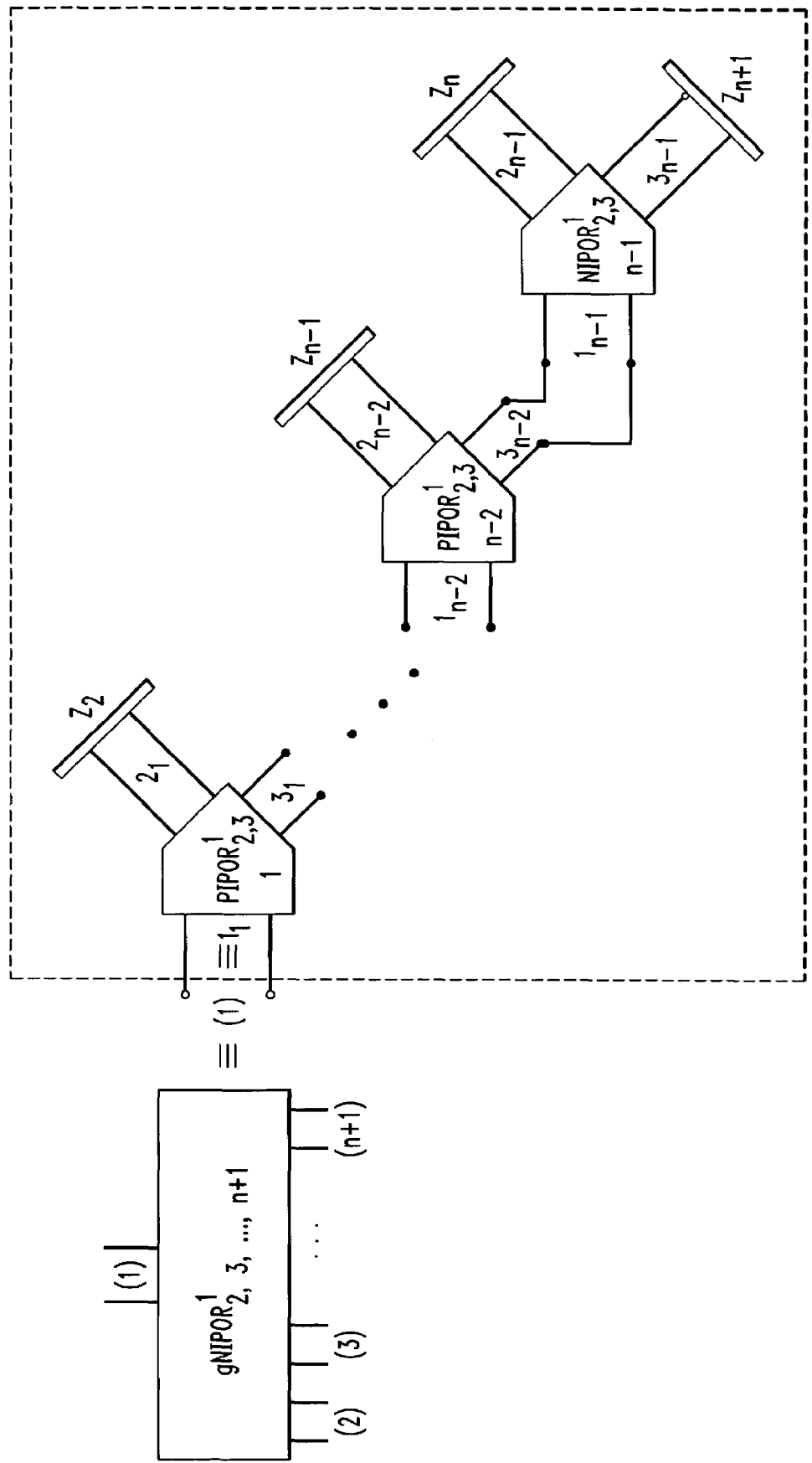
FIG. 27 illustrates in block diagram form a representation of a Generalized Negative Impedance Product Operator network element implemented as a cascade of a single Negative Impedance Product Operator network element and (n−2) Positive Impedance Product Operator network elements.

An (n+1)-port General Negative Impedance Product Operator, n>3, is created by cascading one Negative Impedance Product Operator and (n−1) Positive Impedance Product Operators and appropriately terminating them with 2-terminal impedances, as shown in FIG. 27. The single Negative Impedance Product Operator is shown as located at the end the cascaded sequence, but the Negative Impedance Product Operator can be placed anywhere in the cascade, including the very first place.

Consider the k-th element, Positive Impedance Product Operator or Negative Impedance Product Operator, with k ranging over 1, 2, . . . , (n−1). Using the convention of FIG. 1, let $1_k$, $2_k$ and $3_k$ respectively denote the input and the two loading ports of the k-th element. As shown in FIG. 27, ports $2_k$ and $3_k$ for each of the first (n−3) Positive Impedance Product Operators are terminated respectively with the 2-terminal impedance $Z_{k+1}$ and the next Positive Impedance Product Operator in sequence; ports $2_k$ and $3_k$ of the last Positive Impedance Product Operator (the (n−2)th Positive Impedance Product Operator) are terminated respectively with the 2-terminal impedance $Z_{n-2}$ and the single Negative Impedance Product Operator; and finally, ports $2_k$ and $3_k$ of the Negative Impedance Product Operator (the (n−1)th element in the cascade) are terminated with the impedance loads $Z_n$ and $Z_{n+1}$.

It is easy to see by induction that the configuration of FIG. 27 indeed is a General Negative Impedance Product Operator. First consider the case of the (n−1)th Negative Impedance Product Operator terminated with loads $Z_n$ and $Z_{n+1}$ at ports $2_{n-1}$ and $3_{n-1}$, respectively. By definition, the (n−2)th Positive Impedance Product Operator, terminated with the load $Z_{n-1}$ at port $2_{n-2}$, is also effectively terminated with the load $-Z_n Z_{n+1}$ at port $3_{n-2}$. Hence, the impedance seen at port $1_{n-2}$ is $-Z_{n-1} Z_n Z_{n+1}$. Continuing in this manner, it is evident that the impedance offered by the loaded k-th Positive Impedance Product Operator at port $1_k$ in FIG. 27 is $Z_{k+1}$ × (impedance seen at port $1_{k+1}$ of the loaded (k + 1)th Positive $$\text{Impedance Product Operator}) = Z_{k+1} \times -\prod_{i=k+2}^{n+1} Z_i = -\prod_{i=k+1}^{n+1} Z_i.$$

Specifically, for k=1, the impedance seen at the input or port (1) of the General Negative Impedance Product Operator is $-\prod_{i=2}^{n+1} Z_i$, as asserted.

as asserted.

There are additional possibilities as well. Observe that the General Negative Impedance Product Operator cascade of FIG. 27 could have been constructed with an odd number of Negative Impedance Product Operators and the rest as Positive Impedance Product Operators. As long as there are an odd number of Negative Impedance Product Operators in cascade, the sign of the overall product seen at the input of the General Negative Impedance Product Operator is always negative. Indeed, the odd number of Negative Impedance Product Operators may be interspersed with Positive Impedance Product Operators anywhere in the cascade preserving the desired impedance multiplication property of the General Negative Impedance Product Operator-the effect is permutation invariant with respect to the placement of the elements themselves.

SUMMARY

The family of active non-reciprocal network elements called Impedance Product Operators offer an input impedance that is the product of the 2-terminal impedances that are connected at the remaining ports of the Impedance Product Operator.

What is claimed:

1. A non-reciprocal n-port network element for presenting a determinable impedance at an input port, comprising:
    a 2-terminal input port;
    (n−1) 2-terminal load ports, where n is a positive integer greater than 2, each of said (n−1) 2-terminal load ports terminating a 2-terminal impedance load element; and
    means for presenting an impedance on said 2-terminal input port that comprises a product of the impedances of said 2-terminal load elements terminated at said (n−1) 2-terminal load ports.

2. The non-reciprocal multi-port network element of claim 1, wherein n=3, said means for presenting comprises:
    means for generating voltage- and current-variables at said 2-terminal input port (1) and said (n−1) 2-terminal load ports (2, 3) comprising:

$$\begin{bmatrix} I_1 \\ V_2 \\ V_3 \end{bmatrix} = \begin{bmatrix} 0 & 0 & -1 \\ 1 & 0 & 0 \\ 0 & -1 & 0 \end{bmatrix} \begin{bmatrix} V_1 \\ I_2 \\ I_3 \end{bmatrix} \quad (1)$$

where $V_j$ and $I_j$ denote the voltage- and current-variables at the jth port, j=1, 2, 3, respectively.

3. The non-reciprocal multi-port network element of claim 2, further comprising:
    first, second and third second generation current conveyor means, each of said first, second and third second generation current conveyor means comprising a three-port device, having single terminal ports x, y, z, with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix};$$

where the ± sign is used to denote whether the current conveyor means is designed to operate with a positive or negative unity gain.

4. The non-reciprocal multi-port network element of claim 3 wherein said means for generating comprises:
   means for interconnecting said first, second and third second generation current conveyor means, wherein:
   a first terminal of said 2-terminal input port is connected to said y port of said first second generation current conveyor means and said z port of said second second generation current conveyor means;
   a second terminal of said 2-terminal input port is connected to a second terminal of a first of said (n–1) 2-terminal load ports, said y port of said second second generation current conveyor means, said z port of said third second generation current conveyor means, and a first terminal of an impedance;
   a first terminal of said second 2-terminal input port is connected to said x port of said first second generation current conveyor means;
   a first terminal of a second of said (n–1) 2-terminal load ports is connected to said x port of said second second generation current conveyor means;
   a second terminal of said second of said (n–1) 2-terminal load ports is connected to said x port of said third second generation current conveyor means; and
   said z port of said first second generation current conveyor means is connected to said y port of said third second generation current conveyor means and a second terminal of said impedance.

5. The non-reciprocal multi-port network element of claim 4, wherein said impedance comprises:
   a resistor having an impedance of one ohm.

6. The non-reciprocal multi-port network element of claim 4, wherein each of said first, and said third second generation current conveyor means comprises:
   a positive gain second generation current conveyor means.

7. The non-reciprocal multi-port network element of claim 4, wherein said second second generation current conveyor means comprises:
   a negative gain second generation current conveyor means.

8. The non-reciprocal multi-port network element of claim 1, wherein n>3, further comprising:
   a plurality of impedance converter means, each having three 2-terminal ports for generating voltage- and current-variables at a 2-terminal input port (1) and first and second 2-terminal load ports (2, 3) comprising:

$$\begin{bmatrix} I_1 \\ V_2 \\ V_3 \end{bmatrix} = \begin{bmatrix} 0 & 0 & -1 \\ 1 & 0 & 0 \\ 0 & -1 & 0 \end{bmatrix} \begin{bmatrix} V_1 \\ I_2 \\ I_3 \end{bmatrix} \quad (1)$$

where $V_j$ and $I_j$ denote the voltage- and current-variables at the jth port, j=1, 2, 3, respectively.

9. The non-reciprocal multi-port network element of claim 8, further comprising:
   means for terminating each of said plurality of impedance converter means with a 2-terminal impedance load element on a first of said (n–1) 2-terminal load ports;
   means for interconnecting said plurality of impedance converter means in sequence by connecting said 2-terminal input port of each successive one of said plurality of said impedance converter means in said sequence to a second of said (n–1) 2-terminal load ports on a next successive one of said plurality of said impedance converter means in said sequence; and
   means for terminating said second of said (n–1) 2-terminal load ports of a last one of said plurality of said impedance converter means in said sequence to a 2-terminal impedance load element.

10. The non-reciprocal multi-port network element of claim 9, wherein each of said each of said plurality of impedance converter means comprises:
    first, second and third second generation current conveyor means, each of said first, second and third second generation current conveyor means comprising a three-port device, having single terminal ports x, y, z, with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix};$$

where the ± sign is used to denote whether the current conveyor means is designed to operate with a positive or negative unity gain.

11. The non-reciprocal multi-port network element of claim 10 wherein each of said each of said plurality of impedance converter means further comprises:
    means for interconnecting said first, second and third second generation current conveyor means, wherein:
    a first terminal of said 2-terminal input port is connected to said y port of said first second generation current conveyor means and said z port of said second second generation current conveyor means;
    a second terminal of said 2-terminal input port is connected to a second terminal of a first of said (n–1) 2-terminal load ports, said y port of said second second generation current conveyor means, said z port of said third second generation current conveyor means, and a first terminal of an impedance;
    a first terminal of said second 2-terminal input port is connected to said x port of said first second generation current conveyor means;
    a first terminal of a second of said (n–1) 2-terminal load ports is connected to said x port of said second second generation current conveyor means;
    a second terminal of said second of said (n–1) 2-terminal load ports is connected to said x port of said third second generation current conveyor means; and
    said z port of said first second generation current conveyor means is connected to said y port of said third second generation current conveyor means and a second terminal of said impedance.

12. A method for presenting a determinable impedance at a 2-terminal input port using a non-reciprocal n-port network element, comprising:
    terminating (n–1) 2-terminal load ports, where n is a positive integer greater than 2, each of said (n–1) 2-terminal load ports terminating a 2-terminal impedance load element; and presenting an impedance on said 2-terminal input port that comprises a product of the impedances of said 2-terminal load elements terminated at said (n−1) 2-terminal load ports.

13. The method for presenting a determinable impedance of claim 12, wherein n=3, said step of presenting comprises:

generating voltage- and current-variables at said 2-terminal input port (1) and said (n−1) 2-terminal load ports (2, 3) comprising:

$$\begin{bmatrix} I_1 \\ V_2 \\ V_3 \end{bmatrix} = \begin{bmatrix} 0 & 0 & -1 \\ 1 & 0 & 0 \\ 0 & -1 & 0 \end{bmatrix} \begin{bmatrix} V_1 \\ I_2 \\ I_3 \end{bmatrix} \quad (1)$$

where $V_j$ and $I_j$ denote the voltage- and current-variables at the jth port, j=1, 2, 3, respectively.

14. The method for presenting a determinable impedance of claim 13, using first, second and third second generation current conveyors, each of said first, second and third second generation current conveyors comprising a three-port device, having single terminal ports x, y, z, with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix};$$

where the ± sign is used to denote whether the current conveyor is designed to operate with a positive or negative unity gain further comprising:

interconnecting said first, second and third second generation current conveyor means, wherein:

connecting a first terminal of said 2-terminal input port to said y port of said first second generation current conveyor and said z port of said second second generation current conveyor;

connecting a second terminal of said 2-terminal input port to a second terminal of a first of said (n−1) 2-terminal load ports, said y port of said second second generation current conveyor, said z port of said third second generation current conveyor, and a first terminal of an impedance;

connecting a first terminal of said second 2-terminal input port to said x port of said first second generation current conveyor;

connecting a first terminal of a second of said (n−1) 2-terminal load ports to said x port of said second second generation current conveyor;

connecting a second terminal of said second of said (n−1) 2-terminal load ports to said x port of said third second generation current conveyor; and connecting said z port of said first second generation current conveyor to said y port of said third second generation current conveyor and a second terminal of said impedance.

15. The method for presenting a determinable impedance of claim 12, wherein n>3, and using a plurality of impedance converters, each having three 2-terminal ports for generating voltage- and current-variables at a 2-terminal input port (1) and first and second 2-terminal load ports (2, 3) comprising:

$$\begin{bmatrix} I_1 \\ V_2 \\ V_3 \end{bmatrix} = \begin{bmatrix} 0 & 0 & -1 \\ 1 & 0 & 0 \\ 0 & -1 & 0 \end{bmatrix} \begin{bmatrix} V_1 \\ I_2 \\ I_3 \end{bmatrix} \quad (1)$$

where $V_j$ and $I_j$ denote the voltage- and current-variables at the jth port, j=1, 2, 3, respectively, further comprising:

terminating each of said plurality of impedance converters with a 2-terminal impedance load element on a first of said (n−1) 2-terminal load ports;

interconnecting said plurality of impedance converters in sequence by connecting said 2-terminal input port of each successive one of said plurality of said impedance converters in said sequence to a second of said (n−1) 2-terminal load ports on a next successive one of said plurality of said impedance converters in said sequence; and terminating said second of said (n−1) 2-terminal load ports of a last one of said plurality of said impedance converters in said sequence to a 2-terminal impedance load element.

16. The method for presenting a determinable impedance of claim 15, wherein each of said each of said plurality of impedance converters comprises first, second and third second generation current conveyors, each of said first, second and third second generation current conveyors comprising a three-port device, having single terminal ports x, y, z, with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix};$$

where the ± sign is used to denote whether the current conveyor is designed to operate with a positive or negative unity gain further comprising:

interconnecting said first, second and third second generation current conveyors, wherein:

connecting a first terminal of said 2-terminal input port to said y port of said first second generation current conveyor and said z port of said second second generation current conveyor;

connecting a second terminal of said 2-terminal input port to a second terminal of a first of said (n−1) 2-terminal load ports, said y port of said second second generation current conveyor, said z port of said third second generation current conveyor, and a first terminal of an impedance;

connecting a first terminal of said second 2-terminal input port to said x port of said first second generation current conveyor;

connecting a first terminal of a second of said (n−1) 2-terminal load ports to said x port of said second second generation current conveyor;

connecting a second terminal of said second of said (n−1) 2-terminal load ports is connected to said x port of said third second generation current conveyor; and connecting said z port of said first second generation current conveyor to said y port of said third second generation current conveyor and a second terminal of said impedance.

* * * * *